(12) United States Patent
Paxton et al.

(10) Patent No.: US 7,019,268 B2
(45) Date of Patent: Mar. 28, 2006

(54) WAFER PROCESSING APPARATUS AND METHOD OF USE

(75) Inventors: Theodore A. Paxton, Chandler, AZ (US); Todd Hiar, Gilbert, AZ (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/783,088

(22) Filed: Feb. 23, 2004

(65) Prior Publication Data
US 2005/0184043 A1    Aug. 25, 2005

(51) Int. Cl.
*H05B 3/68* (2006.01)
(52) U.S. Cl. .............................. 219/444.1; 219/443.1; 219/390; 219/405; 219/446.1; 219/447.1; 219/448.17; 219/448.11; 392/416; 392/418; 118/724; 118/725; 118/50.1; 118/728; 118/729; 118/730
(58) Field of Classification Search ................ 219/390, 219/405, 411, 443.1, 444.1, 446.1, 447.1, 219/448.17, 448.11; 392/416, 418; 118/724, 118/725, 50.1, 728–730
See application file for complete search history.

(56) References Cited

U.S. PATENT DOCUMENTS

| 5,431,700 | A |   | 7/1995  | Sloan |
| 5,527,393 | A | * | 6/1996  | Sato et al. .................. 118/725 |
| 5,849,582 | A |   | 12/1998 | Chen et al. |
| 6,137,088 | A |   | 10/2000 | Chen et al. |
| 6,221,781 | B1 |  | 4/2001  | Siefering et al. |
| 6,307,184 | B1 |  | 10/2001 | Womackk et al. |
| 6,329,304 | B1 | * | 12/2001 | Kuznetsov et al. ......... 438/799 |
| 6,753,508 | B1 | * | 6/2004  | Shirakawa ............... 219/444.1 |

* cited by examiner

*Primary Examiner*—Shawntina Fuqua
(74) *Attorney, Agent, or Firm*—Pillsbury Winthrop Shaw Pittman, LLP (57) ABSTRACT

A system, apparatus, and method for thermal processing of substrates undergoing lithographic chemical processes is provided. The thermal processing system includes at least one heating element, a heat distributing plate, having a heating surface and being disposed in thermal communication with the at least one heating element. The heat distributing plate is constructed and arranged to distribute heat from the heating element onto the heating surface. A substrate support, supports a substrate at a position above the heating surface and the system includes an actuator that rotates the substrate relative to the heating surface during a heat transfer operation.

23 Claims, 4 Drawing Sheets

WAFER PROCESSING APPARATUS AND METHOD OF USE

BACKGROUND OF THE INVENTION

1. Field of the Invention

The present invention relates generally to a wafer processing apparatus and method of use. It relates more particularly to a wafer processing apparatus including a mechanism for rotating a wafer in order to transfer heat to or from the wafer in a uniform manner.

2. Description of the Related Art

The terms "patterning means" or "patterning structure" as will be employed herein should be broadly interpreted to refer to means that can be used to endow an incoming radiation beam with a patterned cross-section, corresponding to a pattern that is to be created in a target portion of the substrate. The term "light valve" may also be used in this context. Generally, the pattern will correspond to a particular functional layer in a device being created in the target portion, such as an integrated circuit or other device (see below). Examples of such patterning means include:

(a) a mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

(b) a programmable mirror array: an example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference. In the case of a programmable mirror array, the said support structure may be embodied as a frame or table, for example, which may be fixed or movable as required; and (c) a programmable LCD array: an example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning means as set forth above. Also, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens".

Lithographic exposure apparatuses can be used, for example, in the manufacture of integrated circuits (ICs). In such a case, the patterning means may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time.

In current apparatuses, employing patterning by a mask on a mask table, a distinction can be made between two different types of machine. In one type of lithographic exposure apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction. Because, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

It is to be noted that the lithographic apparatus may also be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

In manufacturing processes employing lithographic exposure apparatuses a pattern (e.g. in a mask or reticle) is imaged or exposed onto a substrate wafer that is at least partially covered by a layer of radiation-sensitive material (resist). Prior to this exposure step, the substrate wafer may undergo various processes, such as priming, resist coating, and a soft bake.

After exposure, the substrate may be subjected to additional processes, such as a post-exposure bake (PEB), chilling, development, a hard bake and measurement/inspection of the imaged features. These post-exposure processes are used as a basis to pattern an individual layer of a device, e.g. an IC. Such a patterned layer may then undergo further post-exposure processes such as etching, ion-implantation (doping), metallization, oxidation, chemo-mechanical polishing, etc., all intended to finish off an individual layer. If several layers are required, then the entire procedure, or a variant thereof, will have to be repeated for each new layer.

As described above, there are generally multiple operations (PEB, hard bake) that involve raising the temperature of a wafer, for example, in order to hasten the setting of a layer of photoresist. Bake operations are generally performed using a plate-like structure that includes one or more heating elements, generally known as a bake plate. The wafer to be processed is held in proximity to, or directly on, the bake plate. In some cases, it may also become necessary or desirable to quickly and uniformly chill the heated wafer to an ambient temperature so that the wafer will not introduce thermal contamination to other equipment in the production process. For this purpose, a chill plate is used.

Combination bake/chill stations have been described, for example, in U.S. Pat. Nos. 5,431,700 and 6,307,184. In these devices, a heating element and a cooling element are disposed in close proximity so that no external robot is required to move the wafer under treatment from one station to another.

Eventually, an array of devices will be present on the substrate (wafer) and these devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

Needless to say, it is important that the features and profile of the pattern exposed on the target fields of the wafer substrate are replicated as accurately as possible. To this end, manufacturers normally specify the critical dimension (CD) of the exposed pattern in order to characterize the features and profile of the pattern and establish a benchmark level of quality and uniformity. Another important consideration is the ability to manipulate the lithographic fabrication process to repeatedly and increasingly yield high-quality substrate wafers.

There are, however, numerous activities during the lithographic fabrication process that affect the critical dimension uniformity (CDU) and compromise the quality of the exposed patterns. Indeed, the very pre- and post-exposure processes that service and treat the substrate wafers may contribute to variations in the CDU. Moreover many of these pre- and post-exposure processes involve the use of chemicals that react with the substrate wafers to achieve an intended effect on the wafer. And, although these chemical reactions may follow predictable Arrhenius behaviors (i.e., reaction rates are a function of temperature), temperature gradients may not be well controlled as the reactions occur. All these factors may contribute to variations and non-uniformities in either the individual target fields, across a wafer, or between wafers—ultimately resulting in loss of productive yields.

SUMMARY OF THE INVENTION

Systems and apparatuses consistent with the principles of the present invention, as embodied and broadly described herein, provide for thermally controlling lithographic chemical processes. One embodiment of the present invention includes, at least one heating element, a heat distributing plate, having a heating surface and being disposed in thermal communication with the at least one heating element, the heat distributing plate being constructed and arranged to distribute heat from the heating element onto the heating surface, a substrate support, constructed and arranged to support a substrate at a position above the heating surface, and an actuator, constructed and arranged to rotate the substrate during a heat transfer operation.

A disclosed method, consistent with the principles of the present invention, provides for thermally controlling the chemical-processing of lithographic substrates. One embodiment of the described method includes heating a heat distributing plate to create a predetermined temperature profile at a heating surface thereof, placing the substrate above and in thermal communication with the heating surface such that heat is transferred from the heating surface to the substrate, and rotating the substrate relative to the heating surface such that variations in the temperature profile transferred to the substrate are reduced.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered to encompass the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the figures, corresponding reference symbols indicate corresponding parts.

DETAILED DESCRIPTION

As noted above, processes that treat the substrate wafers may contribute to variations in CDU that negatively affect the quality and performance of the exposed patterns on the substrate. Such non-uniformities may occur across a target field, across a wafer, and between wafers. Moreover, these non-uniformities depend on a variety of factors, including the rate of chemical reactions on the substrate. As described in greater detail below, the present invention contemplates reducing temperature variation in the wafer by rotating the wafer relative to the bake plate. The relative motion between the heat source and the wafer results in an averaging of differences in temperature across the heat source.

Figure 1:
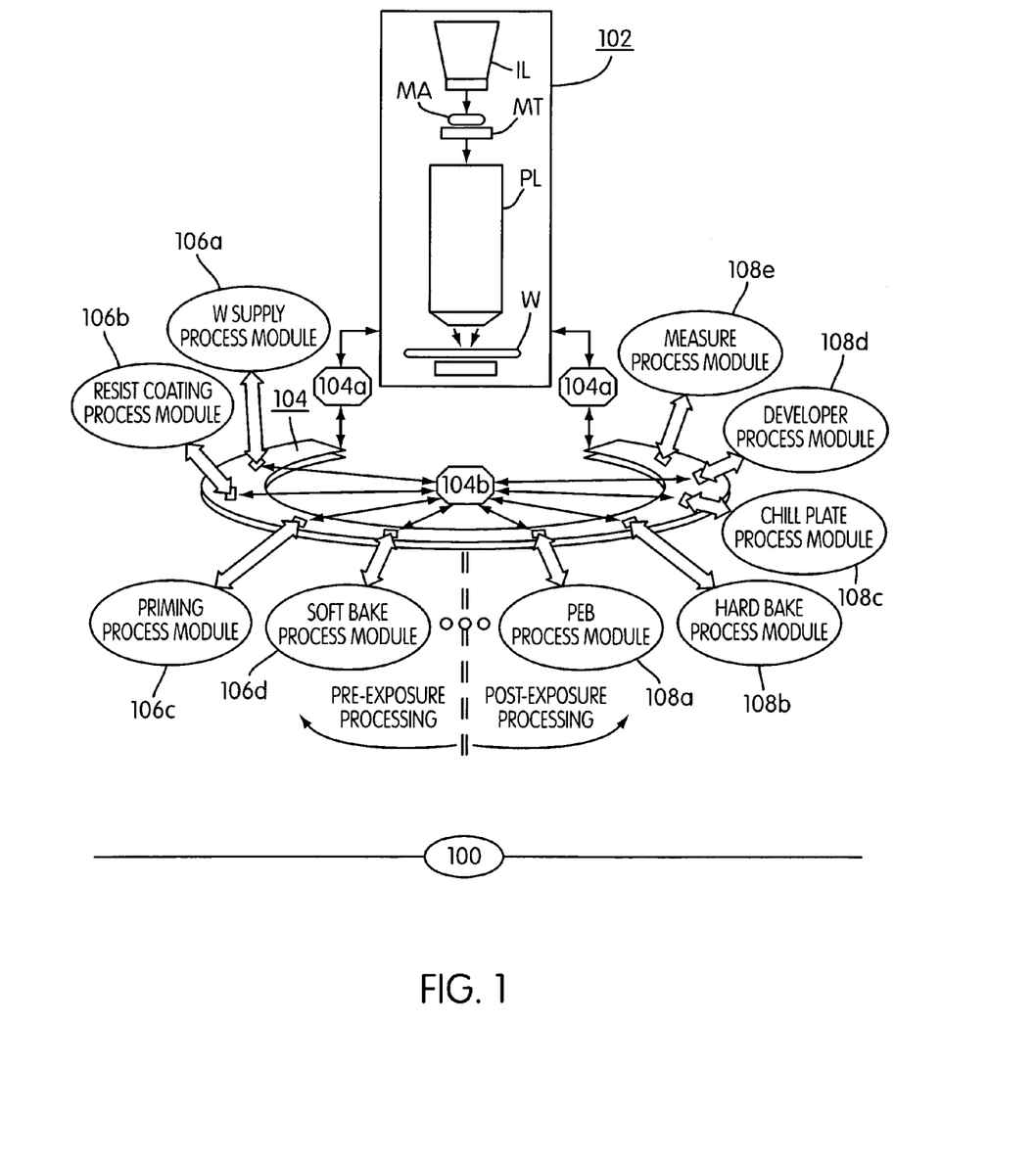
FIG. 1 is a schematic illustration of a photolithographic exposure apparatus and wafer track apparatus.

FIG. 1 schematically depicts lithographic system 100 according to a particular embodiment of the invention. System 100 comprises lithographic exposure apparatus 102, which is configured to expose a pattern onto a substrate wafer, and wafer track apparatus 104, which is configured to transport the substrate wafers between the various pre- and post-exposure processing modules.

Figure 2:
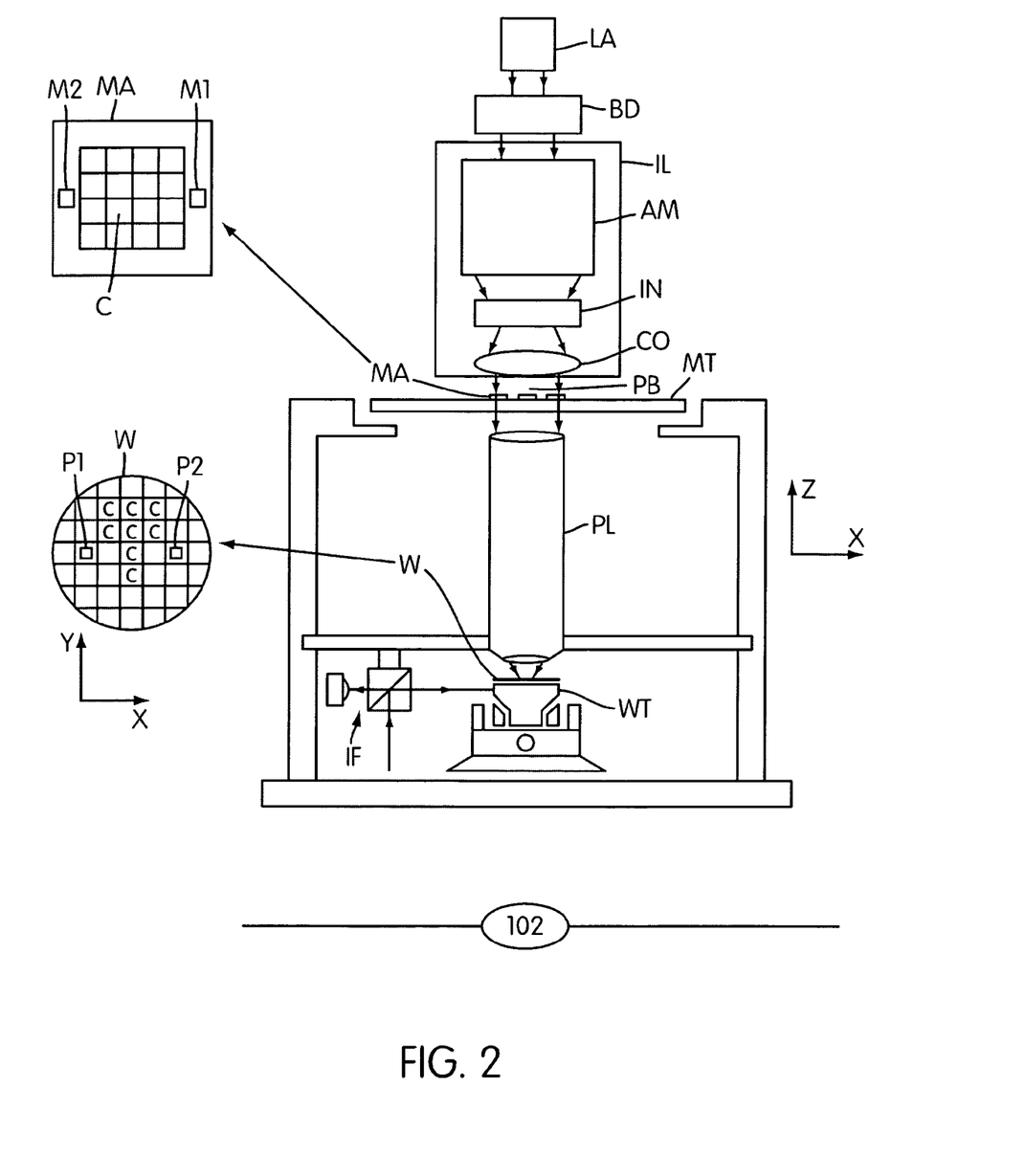
FIG. 2 is a schematic illustration of a lithographic exposure apparatus.

FIG. 2 provides a more detailed illustration of lithographic apparatus 102. As indicated in FIG. 2, lithographic apparatus 102 includes radiation source LA and radiation system IL for providing a projection beam PB, a first object table (e.g. mask table) MT provided with a mask holder for holding a mask MA (e.g. a reticle), and a projection system PL (e.g., lens) for imaging an irradiated portion of the mask MA onto a target portion C (e.g. comprising one or more dies) of the substrate W. As depicted, lithographic apparatus 102 is of a transmissive type (i.e. has a transmissive mask). However, in general, it may also be of a reflective type, for example (with a reflective mask) and, alternatively, apparatus 102 may employ another kind of patterning means, such as a programmable mirror array of a type as indicated above.

Lithographic apparatus 102 further comprises a second object table (e.g., substrate table) WT provided with a substrate holder for holding a substrate W (e.g. a resist-coated silicon wafer).

Source LA produces a beam of radiation, which is fed into illumination system (e.g., illuminator) IL, either directly or after having traversed conditioning means, such as a beam expander Ex, for example. Illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired cross-sectional uniformity and intensity distribution.

It is to be noted with regard to FIG. 2, that source LA may be within the housing of lithographic exposure apparatus 102 (as is often the case when the source LA is a mercury lamp, for example). However, it may also be remote from apparatus 102, as in the case of an excimer laser source. In this scenario, the remote radiation beam is guided into apparatus 102 by virtue of suitable directing mirrors. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means 1F), the substrate table WT can be moved accurately (e.g. so as to position different target portions C in the path of the beam PB). Similarly, the first positioning means can be used to accurately position the mask MA with respect to the path of the beam PB (e.g. after mechanical retrieval of the mask MA from a mask library, or during a scan).

In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus), the mask table MT may just be connected to a short stroke actuator, or may be fixed.

Lithographic apparatus 102 can be used in two different modes:

(a) step mode: mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and (b) scan mode: essentially the same scenario applies, except that a given target portion C is not exposed in a single "flash". Instead, mask table MT is movable in a given direction (the so-called "scan direction", e.g. the y direction) with a speed v, so that projection beam PB is caused to scan over a mask image. Concurrently, substrate table WT is simultaneously moved in the same or opposite direction at a speed $V=M\mu$, in which M is the magnification of the lens PL (typically, $M=\frac{1}{4}$ or $\frac{1}{5}$). In this manner, a relatively large target portion C can be exposed, without having to compromise on resolution.

Returning to FIG. 1, the wafer track apparatus 104 portion of lithographic system 100 interconnects lithographic exposure apparatus 102 with a host of pre-exposure processing modules, which are configured to treat the substrate wafers prior to exposure. These pre-processing modules may include, for example, wafer supply module 106a, resist coating module 106b, priming module 106c, and soft bake module 106d. Additionally, wafer supply module 106a may include a loading station 12 for loading and unloading cassettes containing wafers to be processed.

Similarly, wafer track apparatus 104 interconnects lithographic exposure apparatus 102 with a variety of post-exposure processing modules, which are configured to treat and service the substrate wafers after exposure. These post-exposure processing modules may include, for example, post-exposure bake (PEB) module 108a, hard bake module 108b, chill plate module 108c, developer module 108d, and measurement module 108e.

With respect to measurement process module 108e, it is to be noted that such a module may be used to calibrate metrology information. For example, process module 108e may be configured to measure and assess a host of wafer substrate attributes and artifacts that relate to CDU, such as the CD of the entire substrate, the CD of the individual target fields, and various profile dimensions. To this end, measurement process module 108e may comprise a scanning electron microscope (SEM), electrical line measurement (ELM) devices, or similar devices suitable for such measurement purposes.

Wafer track apparatus 104 may include an interface section 104a configured to direct the transport of wafer substrates W to and from lithographic exposure apparatus 102. Wafer track apparatus 104 may also include a second interface section 104b configured to direct the transport of wafer substrates W between the various processing modules. As such, the wafer substrates W are delivered to, processed by, removed from, and transported between the processing modules by wafer track apparatus 104.

Figure 3:
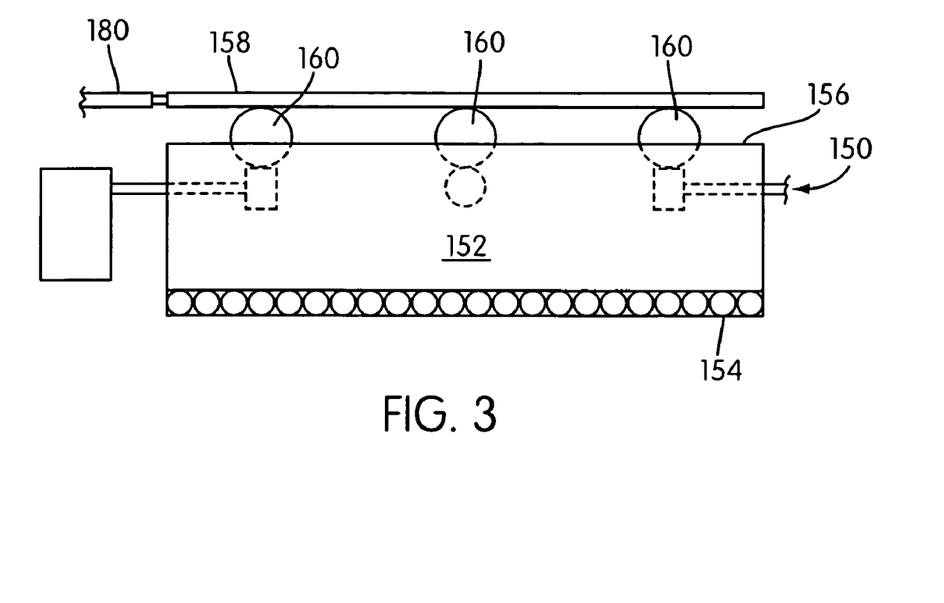
FIG. 3 is a schematic side view illustration of a bake plate in accordance with an embodiment of the present invention.

The various bake plates located at the bake modules, 106d, 108b can, in general, be the same or similar devices. FIG. 3 illustrates a bake plate 150 that can be used in either position of the apparatus shown in FIG. 1.

During bake operations, the wafer should be heated in a uniform manner, specifically, the heating should be uniform to within approximately 0.1° C. As noted above, various chemical reactions taking place on the wafer have a rate that is temperature dependent. In this regard, the bake plate 150 has a main body 152 that is designed to distribute heat evenly to the wafer. This is achieved, in part, by making the main body 152 from a material that conducts heat well, such as, for example, aluminum and by making it relatively thick, for example on the order of 1". As a result, any non-uniformities present at the back of the main body 152 will tend to even themselves out at the front.

A heating element 154 is located generally below and in thermal communication with the main body 152. The heating element 154 may be of a simple construction or may alternately include multiple, separately controllable sub-elements. The temperature profile at the heating surface 156 depends on a number of factors including the heat capacity and thermal conductivity of the main body 152, the size, shape and heat output of the heating element 154, the shape of the main body 152 and the ambient temperature. By choosing a material for the main body that has a good thermal conductivity, hot spots resulting from uneven heating from heating element 154 will tend to be smeared (i.e., the heat transfer function of the main body is such that the amplitude of any varying function describing the heat variation at the back side is greatly attenuated at the heating surface 156).

In particular, because the main body 152 is, in most cases, a circular, plate-like structure, its outer edges tend to be cooler than the central region. This is because the central region is surrounded laterally by other portions of the main body 152, and thus in thermal contact primarily with other portions of the main body, while edge portions are in thermal contact with the ambient atmosphere. As a result, it may be beneficial to control the heating element 154 such that it applies more heating near the periphery than near the central region by, for example, controlling the separately controllable sub-elements described above.

Because the heating of a wafer 158 supported above the main body 152 also depends on the distance between the wafer 158 and the main body 152, it is important to maintain a constant distance between the main body 152 and the wafer 158. In general, this distance is on the order of mils and should be accurate to within 0.5%, e.g., 0.006 in ±0.00003 in. For this purpose, a set of supports 160 is provided to support the wafer 158 above the main body 152 at a predetermined distance. In the case that the supports 160 support the wafer 158 at some tilt relative to the heating surface 156, the rotation of the wafer relative to the heating surface 156 can reduce any variation in heating due to differences in distance and thereby reduce the necessary accuracy of the vertical position of the wafer 158.

The supports 160 are preferably made from a material having a relatively low thermal conductivity. Because they are positioned near to or in contact with the heating surface 156, if they were thermally conductive, they would tend to transmit heat to those portions of the wafer 148 where the supports 160 contact the wafer. Likewise, the supports 160 should, in general, have a relatively small area of contact with the wafer 158. Because the supports 160 block a portion of the wafer 158 from receiving heat radiated from the heating surface 156 where they are in contact, it is beneficial for that contact area to be as small as practical. As such, it is generally of benefit to provide three supports 160, as that is a minimum number to provide a stable, but not over-determined support. Further, it is generally of benefit for the supports to have a curved upper supporting surface such that the wafer 158 can naturally align itself in a minimum contacting configuration, touching the supports only where the wafer's surface is tangent to the curved surface of the supports 160.

Figure 3A:
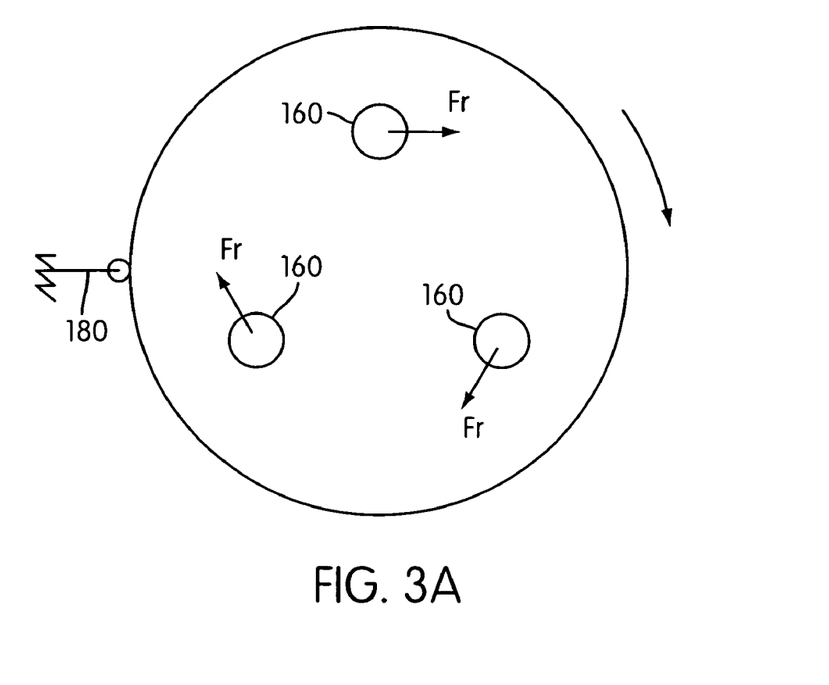
FIG. 3A is a schematic top view illustration of the bake plate of FIG. 3.

In one embodiment, the present invention contemplates a group of three supports 160 that comprise ball bearings made from a ceramic material having a relatively low thermal conductivity. The bearings are partially above and partially below the heating surface 156 of the bake plate 150. An actuator, or drive system 170, is constructed and arranged to provide a driving force to the supports 160 so that they are rotated relative to the main body 162 such that they produce a force $F_r$ on the wafer 158 which is perpendicular to the radius of the wafer 158 that passes through each respective support 160, as shown in FIG. 3A.

The result is that the wafer 158 rotates relative to the heating surface 156 thereby averaging the heat to which the wafer is exposed for any given radial position on the wafer 158. Furthermore, because the supports 160 do not constantly contact any particular point on the wafer 158, there is no point that is entirely blocked from the heating surface 156 as would be the case with a static support. It may be advantageous to include a drift controlling structure 180 that is arranged near the periphery of the rotating wafer 158 such that the wafer does not move laterally relative to the bake plate 150. As shown in FIG. 3, the drift controlling structure may consist of pins or idler-wheel type devices. It is also possible for such a drift controlling structure to provide for some relatively small degree of drift, thereby allowing the wafer 158 some freedom to move from its center so that heating uniformity is further improved.

Figure 4:
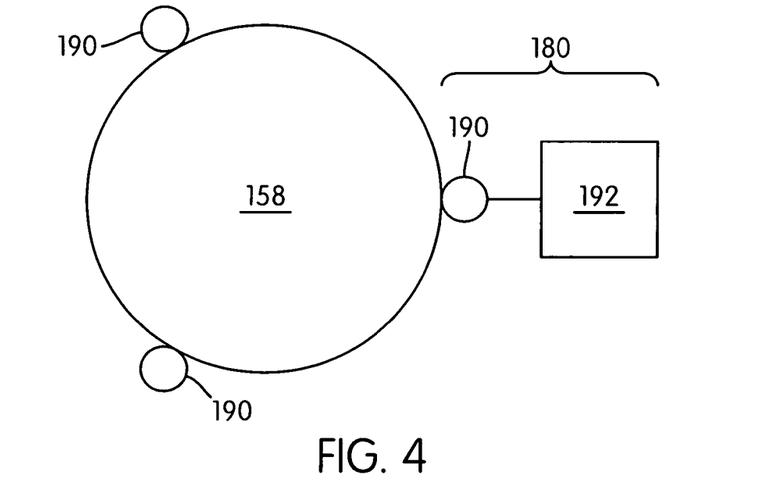
FIG. 4 is a schematic illustration of a bake plate in accordance with another embodiment of the present invention.

Alternately, the drift controlling structure 180 itself may act as the force transmission between an actuator and the rotating wafer 158. In one such embodiment, shown in FIG. 4, the drift controlling structure 180 includes wheels 190 that engage an edge of the wafer 158 and are driven by an actuator 192. The rotating wheels pushing against the edge of the wafer 158 produce rotational movement of the wafer relative to the heating surface 156.

Figure 5:
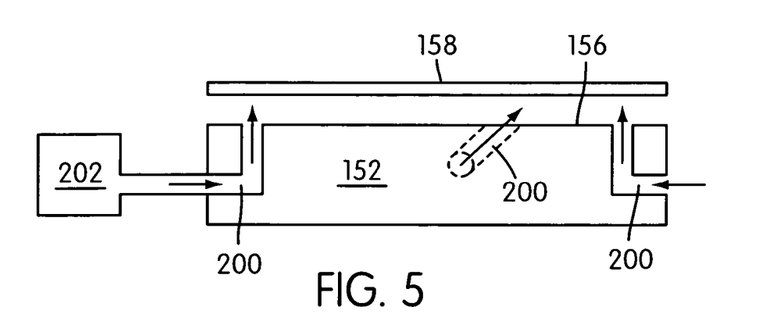
FIG. 5 is a schematic illustration of a bake plate in accordance with another embodiment of the present invention.

In an alternate embodiment, as shown in FIG. 5, the main body 152 includes one or more internal channels 200. The channels 200 are in fluid communication with a gas supply 202 that is arranged to provide gas at a controlled pressure to the channels. The gas is preferably an inert gas such as $N_2$, He, Ne or the like. The force of the gas exiting the channels 200 forms a gas bearing that is capable of supporting the wafer 158 above the heating surface 156. In order to produce rotational motion, the channels may be angled relative to the heating surface 156. By appropriate control of the gas flow, the rate of rotation of the wafer 158 and the distance between the wafer 158 and the heating surface 156 may be controlled.

The gas supply may advantageously include temperature control so that the gas enters the channels 200 at a temperature relatively close to the temperature of the heating surface 156. The gas will generally be further heated during its passage through the channels so that it more closely conforms to the desired baking temperature. The flow of heated gas may thereby increase the heat transfer between the bake plate 150 and the wafer 158, reducing the total processing time. As with the previous embodiments, a drift control structure 180 may be employed to prevent walk-off of the wafer.

Figure 6:
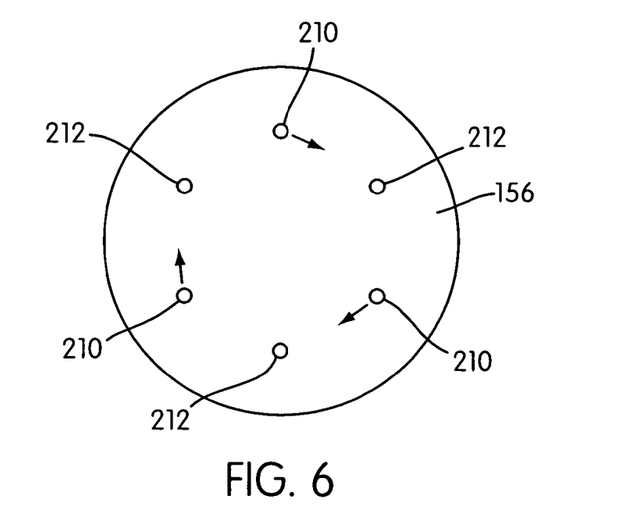
FIG. 6 is a schematic illustration of a bake plate in accordance with another embodiment of the present invention.

In another embodiment, shown in FIG. 6, the supports 160 comprise two separate sets of pins 210, 212. Each set of pins 210, 212 is independently engageable with a wafer 158 to support it above the heating surface. Initially, the first set of pins 210 supports the wafer 158 above the heating surface 156. After a predetermined time, the first set of pins 210 is moved circumferentially to rotate the supported wafer 158. The second set of pins 212 extends, while the first set of pins 210 is retracted, such that the wafer 158 is supported on the second set of pins 212. The sequence of steps may be repeated at predetermined intervals to effectively rotate the wafer 158 relative to the heating surface 156.

The preceding detailed description refers to the accompanying drawings that illustrate exemplary embodiments consistent with the present invention. Other embodiments are possible and modifications may be made to the embodiments without departing from the spirit and scope of the invention. For example, the embodiments described below may, instead, be implemented in different embodiments of software, firmware, and hardware in the entities illustrated in the figures. As such, the operation and behavior of the present invention will be described with the understanding that modifications and variations of the embodiments are possible, given the level of detail present herein. Thus, the preceding detailed description is not meant or intended to limit the invention—rather the scope of the invention is defined by the following claims.

What is claimed is:

1. A thermal processing apparatus, comprising:
   at least one heating element;
   a heat distributing plate, having a heating surface and being disposed in thermal communication with the at least one heating element, the heat distributing plate being constructed and arranged to distribute heat from the heating element onto the heating surface;
   a substrate support, constructed and arranged to support a substrate at a position above the heating surface;
   an actuator, constructed and arranged to rotate the substrate during a heat transfer operation; and
   a drift controlling structure configured to control a lateral movement of the substrate relative to the heat distributing plate and/or rotate the substrate.

2. A thermal processing apparatus according to claim 1, wherein the substrate support is rotated by the actuator to transmit rotation of the actuator to the substrate.

3. A thermal processing apparatus according to claim 1, wherein the at least one heating element comprises an array of heating elements.

4. A thermal processing apparatus according to claim 3, wherein at least two heating elements of the array of heating elements are independently controllable.

5. A thermal processing apparatus according to claim 1, wherein the substrate support further comprises a plurality of spheres disposed such that at least a portion of each of the spheres extends beyond the heat transfer surface and the spheres are rotatable by action of the actuator to transmit rotational motion to the substrate.

6. A thermal processing apparatus according to claim 5, wherein the plurality of spheres comprises exactly three spheres and the spheres comprise a thermally insulating material.

7. A thermal processing apparatus according to claim 1, wherein the drift controlling structure comprises a plurality of members constructed and arranged to contact an edge of the substrate.

8. A thermal processing apparatus according to claim 7, wherein the members contact the edge of the substrate consistently during processing.

9. A thermal processing apparatus according to claim 7, wherein the members contact the edge of the substrate intermittently, when the substrate has drifted beyond a predetermined acceptable range.

10. A thermal processing apparatus according to claim 7, wherein the members further comprise rotatable members in contact with the edge of the substrate.

11. A thermal processing apparatus according to claim 10, wherein the rotatable members are drivable by the actuator such that they exert a rotational force on the substrate to rotate the substrate.

12. A thermal processing apparatus according to claim 1, wherein the substrate support comprises a gas bearing.

13. A thermal processing apparatus according to claim 12, wherein the gas bearing is controllable to act as the actuator.

14. A thermal processing apparatus according to claim 12, further comprising a temperature controlling unit constructed and arranged to control a temperature of a gas used to form the gas bearing.

15. A method of thermally processing a substrate comprising:
    heating a heat distributing plate to create a predetermined temperature profile at a heating surface thereof;
    placing the substrate above and in thermal communication with the heating surface such that heat is transferred from the heating surface to the substrate;
    rotating the substrate relative to the heating surface such that variations in the temperature profile transferred to the substrate are reduced; and
    controlling a drift of the rotating substrate to provide additional control of temperature across the substrate so as to further reduce variation in the temperature profile transferred to the substrate.

16. A thermal processing apparatus according to claim 1, wherein said heating element is controllable such that the substrate is heated substantially uniformly.

17. A thermal processing apparatus according to claim 1, wherein the substrate support has a relatively small area of contact with the substrate such that the support interferes minimally with distribution of heat radiated from the heating surface.

18. A thermal processing apparatus according to claim 1, wherein the drift controlling structure comprises a plurality of pins, a plurality of idler wheels or a combination thereof.

19. A thermal processing apparatus according to claim 1, wherein the drift controlling structure comprises a plurality of wheels adapted to engage an edge of the substrate.

20. A thermal processing apparatus, comprising:
    at least one heating element;
    a heat distributing plate, having a heating surface and being disposed in thermal communication with the at least one heating element, the heat distributing plate being constructed and arranged to distribute heat from the heating element onto the heating surface;
    a substrate support, constructed and arranged to support a substrate at a position above the heating surface; and
    an actuator, constructed and arranged to rotate the substrate during a heat transfer operation,
    wherein the substrate support comprises a plurality of spheres disposed such that at least a portion of each of the spheres extends beyond the heat transfer surface and the spheres are rotatable by action of the actuator to transmit rotational motion to the substrate.

21. A thermal processing apparatus according to claim 20, wherein the plurality of spheres comprises exactly three spheres and the spheres comprise a thermally insulating material.

22. A thermal processing apparatus, comprising:
    at least one heating element;
    a heat distributing plate, having a heating surface and being disposed in thermal communication with the at least one heating element, the heat distributing plate being constructed and arranged to distribute heat from the heating element onto the heating surface;

a substrate support, constructed and arranged to support a substrate at a position above the heating surface; and
an actuator, constructed and arranged to rotate the substrate during a heat transfer operation,
wherein the substrate support comprises a gas bearing and the gas bearing is controllable to act as the actuator.

23. A thermal processing apparatus according to claim 22, further comprising a temperature controlling unit constructed and arranged to control a temperature of a gas used to form the gas bearing.

* * * * *